(12) United States Patent
Golshan

(10) Patent No.: US 6,581,018 B1
(45) Date of Patent: Jun. 17, 2003

(54) MULTIPLEXER SELECT LINE EXCLUSIVITY CHECK METHOD AND APPARATUS

(75) Inventor: Farideh Golshan, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 253 days.

(21) Appl. No.: 09/625,522

(22) Filed: Jul. 26, 2000

(51) Int. Cl.[7] .................. G01R 27/23; G01R 31/00
(52) U.S. Cl. ............................ 702/117; 714/736
(58) Field of Search .................. 702/57, 58, 81, 702/82, 108, 109, 117–120, 123, 183, 185; 714/724, 735–738, 742; 716/4, 5

(56) References Cited

U.S. PATENT DOCUMENTS

| | | | | |
|---|---|---|---|---|
| 4,161,276 A | * | 7/1979 | Sacher et al. ............ 714/724 |
| 4,527,115 A | * | 7/1985 | Mehrotra et al. ....... 324/158.1 |
| 4,910,728 A | * | 3/1990 | Dechene ............... 370/242 |
| 5,528,165 A | * | 6/1996 | Simovich et al. .......... 326/21 |
| 5,604,756 A | | 2/1997 | Kawata ................ 714/773 |
| 5,896,300 A | | 4/1999 | Raghavan et al. ......... 716/10 |
| 5,903,577 A | | 5/1999 | Teene ................. 714/724 |
| 6,182,020 B1 | * | 1/2001 | Fairbanks ............ 324/76.11 |

FOREIGN PATENT DOCUMENTS

| | | | | |
|---|---|---|---|---|
| JP | 05135126 A | * | 6/1993 | ......... B60H/1/00 |
| JP | 11072539 A | * | 3/1999 | ......... G01R/31/28 |

* cited by examiner

Primary Examiner—Marc S. Hoff
Assistant Examiner—Manuel L. Barbee
(74) Attorney, Agent, or Firm—Martine & Penilla, LLP

(57) ABSTRACT

Disclosed herein is a system and method for determining whether multiplexers select lines within a circuit are exclusive of one another. The disclosed invention may be performed in an automated manner on one or more multiplexers within subunit, across subunits, within units, across units, or within entire modules. The method and system employs the application of logical circuit analysis in combination with predefined gate logic to ascertain select line exclusivity in an automated and flexible fashion.

3 Claims, 5 Drawing Sheets

MULTIPLEXER SELECT LINE EXCLUSIVITY CHECK METHOD AND APPARATUS

BACKGROUND OF THE INVENTION

1. Field of the Invention

The present invention relates generally to test circuitry and circuit checking systems. More particularly, the present invention relates to a system and method for determining the exclusivity of signals as required for multiplexer select lines.

2. The Prior Art

The use of multiplexers (also referred to as "MUXES") in complex circuitry is known in the art. Also known is the need to ensure signal exclusivity in multiplexers amongst the plurality of selection lines indicated for each multiplexer. That is, given a plurality of select lines to a multiplexer, only one such select line may be active or "hot" at a given time. In the event of a failure regarding this rule, that is, more than one select line active in the multiplexer simultaneously, adverse circuit conditions will likely be the result (i.e. short between power and ground, or high current conditions in the circuit, resulting in damage or "burnout" in circuit devices, as well as the circuit outputting undesirable results).

One way to avoid such problems in the prior art was to carefully design such circuits to avoid multiple select line simultaneous operation. However, as circuits become increasingly complex, including literally thousands of multiplexers in the overall circuit, theoretical circuit design controls become inherently inadequate. Furthermore, manually checking such circuits, one multiplexer at a time, during circuit testing is both time-consuming and woefully inadequate.

BRIEF DESCRIPTION OF THE INVENTION

To overcome these and other shortcomings of the prior art, disclosed herein is a system for testing multiplexer select line exclusivity in a fast, efficient, and comprehensive manner. By employing a gate circuit and checking the output of that circuit, one or all multiplexers in a circuit may be singularly or comprehensively analyzed for "hot" multiplexer exclusivity. That is, the system disclosed hereinafter applies a gate circuit appropriately to a multiplexer and then, via a series of processes, analyzes whether that multiplexer passes a test for select line exclusivity.

Such a process may proceed multipexer by multiplexer through a given circuit subunit, unit, or through a plurality of units coupled to a plurality of input/output devices. Since the process is automated, it may step from one multiplexer to the next in a subunit. Alternately, it may analyze all multiplexers within a subunit, or all multiplexers in all associated subunits within a unit. Furthermore, this process can also analyze whole units containing subunits, or multiple units as necessary. Simply put this system is not limited by prior art constraints such as predefined circuit topology. Rather, as is desirable, all related circuit elements, multiplexers, may be evaluated individually or together to achieve the broadest circuit multiplexer testing in less time than heretofore possible.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons having the benefit of this disclosure.

Figure 1:
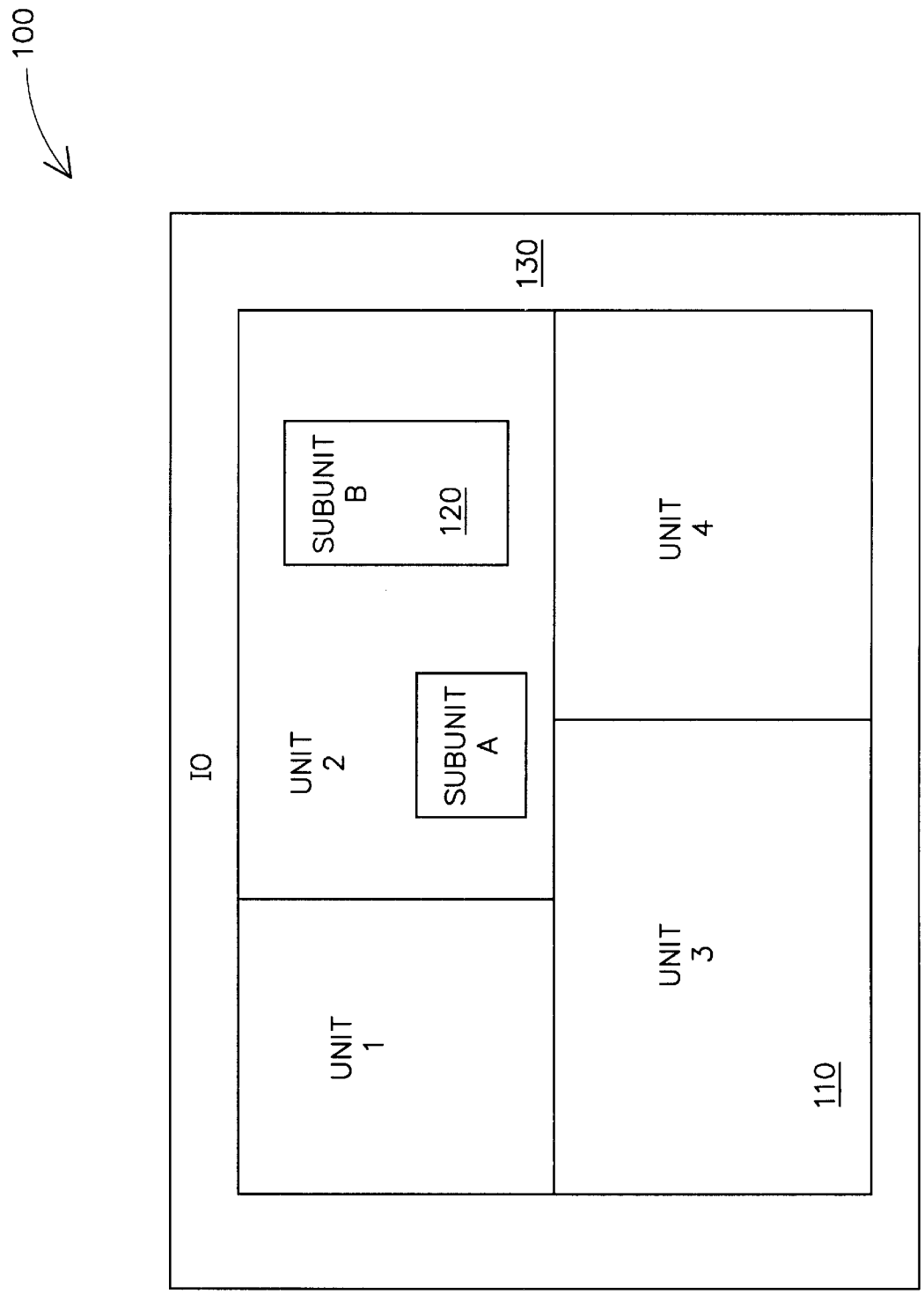
FIG. 1 is a schematic diagram of an exemplary environment of the present invention.

Referring to the drawing figures, wherein like numerals denote like parts throughout the drawing figures, FIG. 1 is directed to a typical circuit architectural environment 100. Within environment 100 are a plurality of units 110. Within the plurality of units 110 are subunits 120. Subunits 120 may include multiplexers which may have circuit relationships with one another either within a subunit, amongst subunits, within units, or amongst units. Furthermore, the units may be operatively coupled to IO interfaces 130 within a module. It would be desirable, from this point of view, to be able to check multiplexers not only on the subunit and unit level, but also throughout the entire module. This desire is achieved in the disclosed invention.

Figure 2:
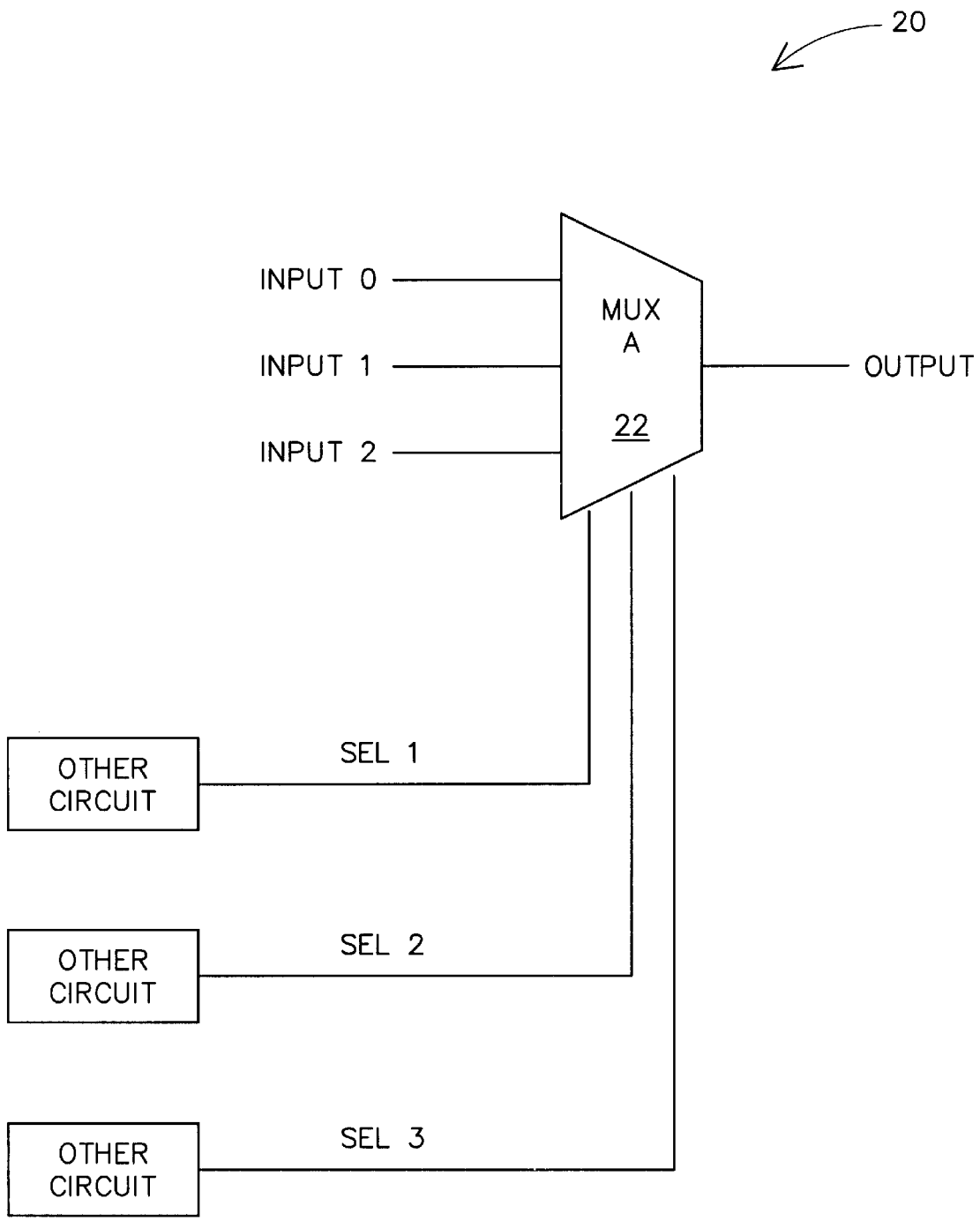
FIG. 2 is a schematic diagram of a typical multiplexer and related circuitry.

Referring now to FIG. 2, a typical multiplexer circuit 20 is depicted. Multiplexer 22 includes three input lines (input 0, input 1, and input 2) and one output line. Multiplexer 22 also includes three select lines (SEL 1, SEL 2, and SEL 3). Of course, as will be appreciated by those individuals skilled in the art, such multiplexers may include any of a variety of inputs, outputs, and selects. Hence, multiplexer circuit 20 is described only by way of example and is not intended in any way to limit the invention. Multiplexer 22 has been instantiated with the nomenclature of MUX A. As will also be appreciated by those skilled in the art, signal from other circuit devices to SEL 1, SEL 2, or SEL 3 must be exclusive to one, and only one, of the three select lines. If signal from other circuit devices were to be presented to more than one select line at a time, undesirable results would be likely. Therefore, it is desirable to ensure that, no matter the circuit conditions, only one select line is active or "hot" given any originating circuit signal combinations.

Figure 3:
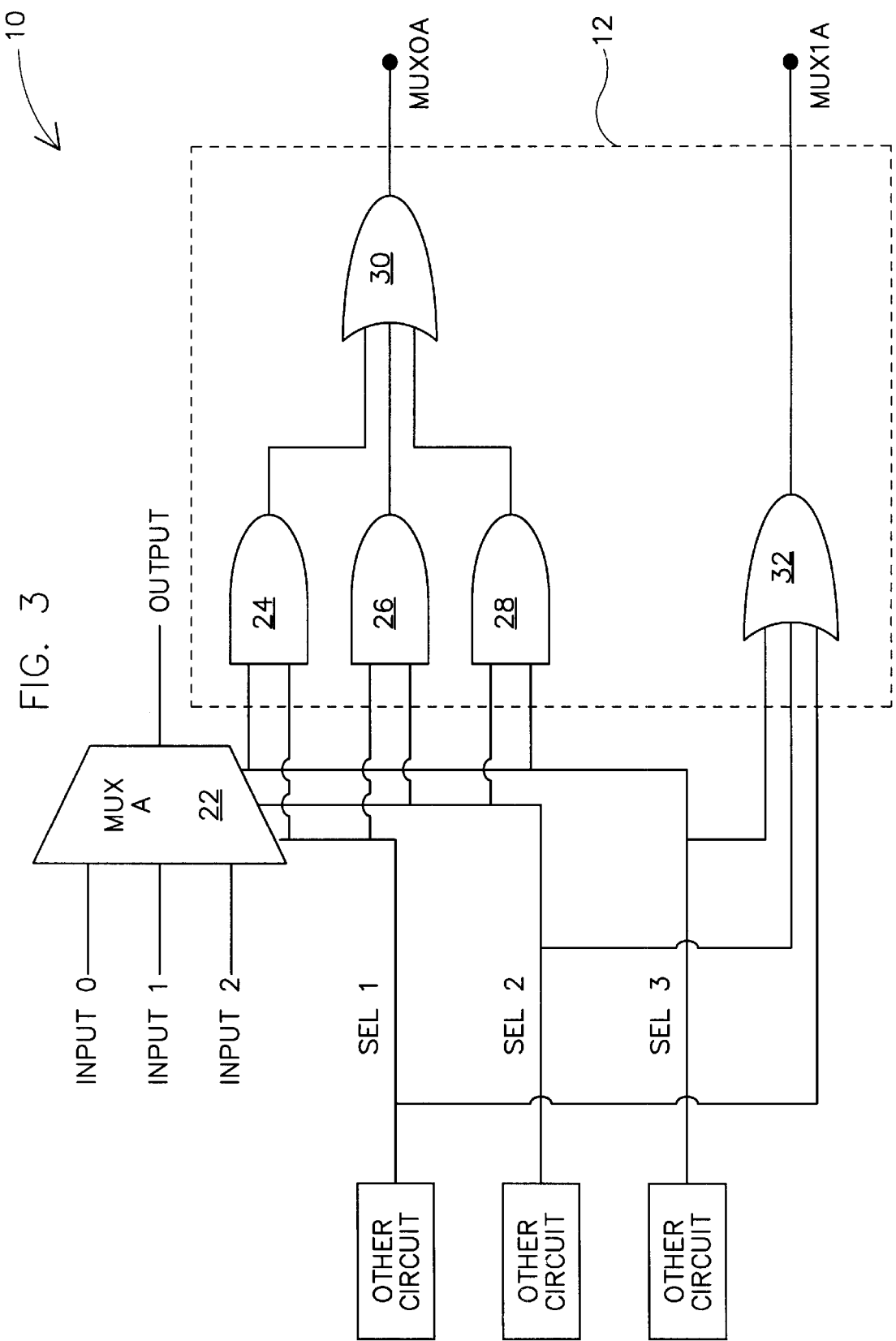
FIG. 3 is a schematic diagram of a multiplexer circuit operatively coupled to the test gate circuitry of the present invention.

Referring now to FIG. 3, a test circuit 12 is depicted in operative communication with the previously described multiplexer 22, thus depicting a combined multiplexer/gate array circuit 10. More particularly, test gate circuit 12 includes a first AND gate 24, a second AND gate 26, and a third AND gate 28. Test gate circuit 12 also includes two OR gates 30 and 32. One of which is operatively coupled to all three AND gates and one of which is operatively coupled to two of the select lines of multiplexer 22.

In this preferred embodiment, first AND gate 24 includes two inputs and one output, wherein one of the inputs is operatively coupled to SEL 3 and the other input is operatively coupled to SEL 1. The output of first AND gate 24 is operatively coupled to one of the input lines of OR gate 30.

Similarly, AND gate 26 also includes two input lines. One of the AND gate 26 input lines is operatively coupled to SEL 1, while the other input line is operatively coupled to SEL 2. The output of AND gate 26 is operatively coupled as well to one of the three inputs of OR gate 30.

Likewise, the inputs of AND gate 28 are operatively coupled to SEL 2 and SEL 3 respectively. While the output of AND gate 28 is also operatively coupled to one of the three inputs of OR gate 30. The output of OR gate 30 constitutes one of the test nodes, in this case instantiated as MUX0A.

The other test node, MUX1A, is defined by the output of OR gate 32, where the three inputs of OR gate 32 are operatively coupled to SEL 1, SEL 2, and SEL 3 respectively. It should be noted that the two test node names relate to the test circuit and the multiplexer being tested. That is the "A" in each node name refers to MUX A as opposed to other multiplexers to be tested. While the "0" and the "1" in each test node name, refers to the output necessary at that node for a "pass" to be given to that multiplexer as will now be appreciated by those with understanding of gate logic. A truth table for the appropriate pass/fail results is depicted in Table 1.

TABLE 1

| SEL 1 | SEL 2 | SEL 3 | PASS/FAIL |
|---|---|---|---|
| 0 | 0 | 0 | FAIL |
| 0 | 0 | 1 | PASS |
| 0 | 1 | 0 | PASS |
| 0 | 1 | 1 | FAIL |
| 1 | 0 | 0 | PASS |
| 1 | 1 | 0 | FAIL |
| 1 | 0 | 1 | FAIL |
| 1 | 1 | 1 | FAIL |

Furthermore, as noted in Table 1, certain other undesirable cases are also considered failures. First, the 000 or no signal case is considered a failure (a design error or short may be indicated). Simply put, unless the multiplexer has one (and only one) "hot" select line, something is wrong with the circuit and requires correcting and or analysis. Such correcting, analysis, and circuit redesign is beyond the scope of this invention.

Thus, for example, the second multiplexer in the circuit may be instantiated as MUX B and would include test node outputs MUX0B and MUX1B. Although these nomenclatures are simple to evaluate, more elaborate nomenclature schemes may be employed without departing from the scope of this invention. It should also be noted that while actual gate circuitry may be employed to facilitate testing, virtual circuitry is more desirable for this application as will be appreciated by those skilled in the art informed by this disclosure.

Figure 4:
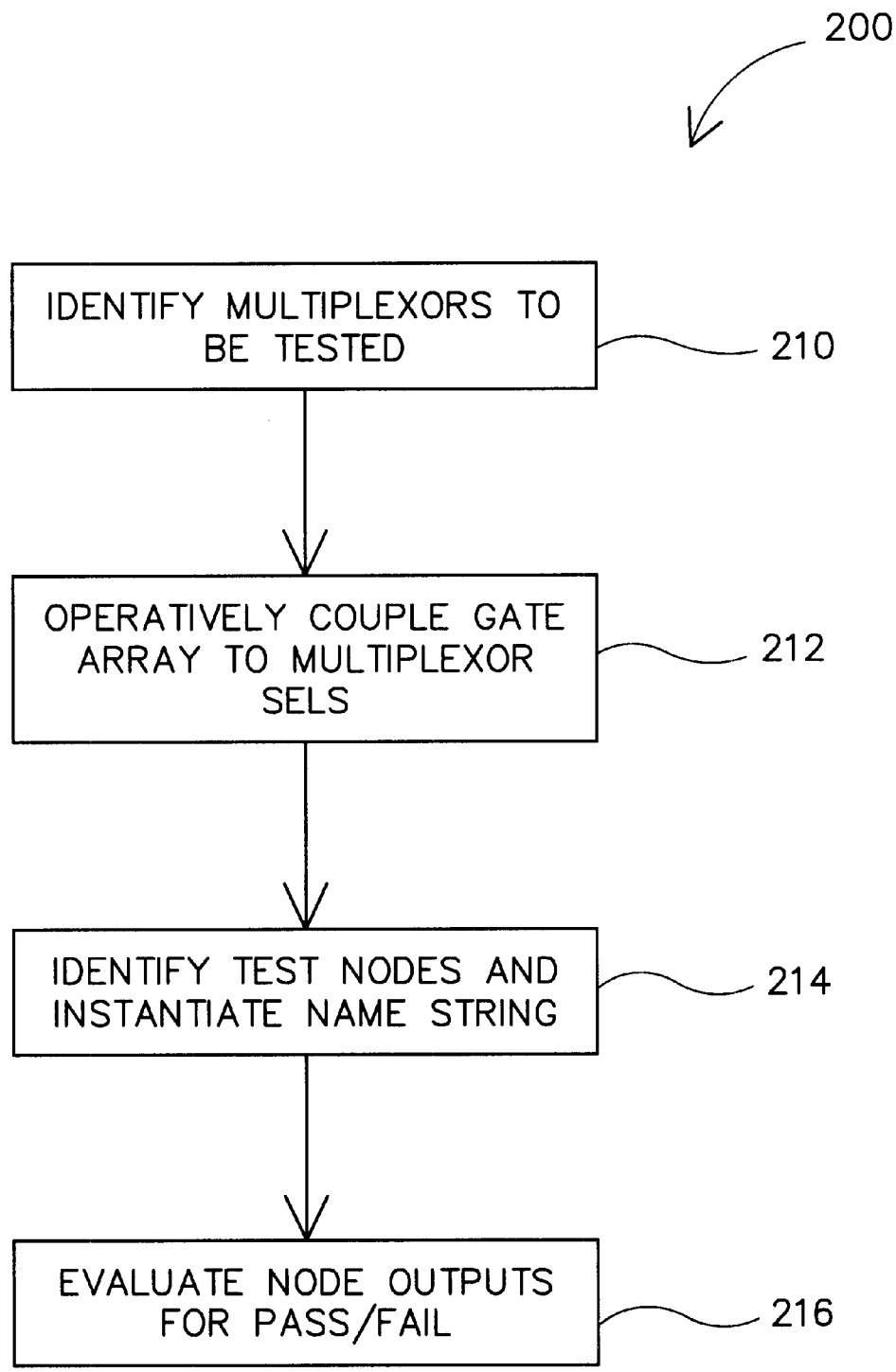
FIG. 4 is a flowchart of an overview of the process of the present invention.

Turning now to FIG. 4, an overview 200 of the error detection process employed is depicted. Generally speaking, the first step in the process is to identify each multiplexer to be tested as in step 210. As indicated above, all multiplexers are instantiated with specified nomenclature such as MUX A, MUX B, MUX C, and so forth.

Thereafter, as described above, the gate array circuit 12 is operatively coupled to the multiplexers to be tested as in step 212. In this manner, then, test nodes may be identified and name strings instantiated to them as in step 214. As described above, the test node name strings will include nomenclature related to both the expected output of the test node and the multiplexer being tested. That is, as shown in FIG. 3, the test node may be instantiated as MUX0A, where the 0 is the value to be compared to the actual output of the test node upon testing, and MUX A is the multiplexer being tested. The nomenclature could just as well be MUXA0 or any other nomenclature which includes an identification of the multiplexer being tested and the expected output value or variations of the same and may also include other interesting but unnecessary information.

Thereafter, each of the test node outputs is evaluated as in step 216. If the test node output corresponds with the instantiated test node value, then a pass is recorded. On the other hand, if any output other than that which matches the instantiated test node name string expected value is output, a fail is recorded. For example, if the first test node name string is MUX1A and the output for that node is 1 and the second test node name string is MUX0A and the output for that node is 0, MUX A is recorded as a pass. On the other hand if anything except a 1 is output from test node MUX1A or anything except a 0 is output from test node MUX0A, then a fail is recorded for MUX A.

Figure 5:
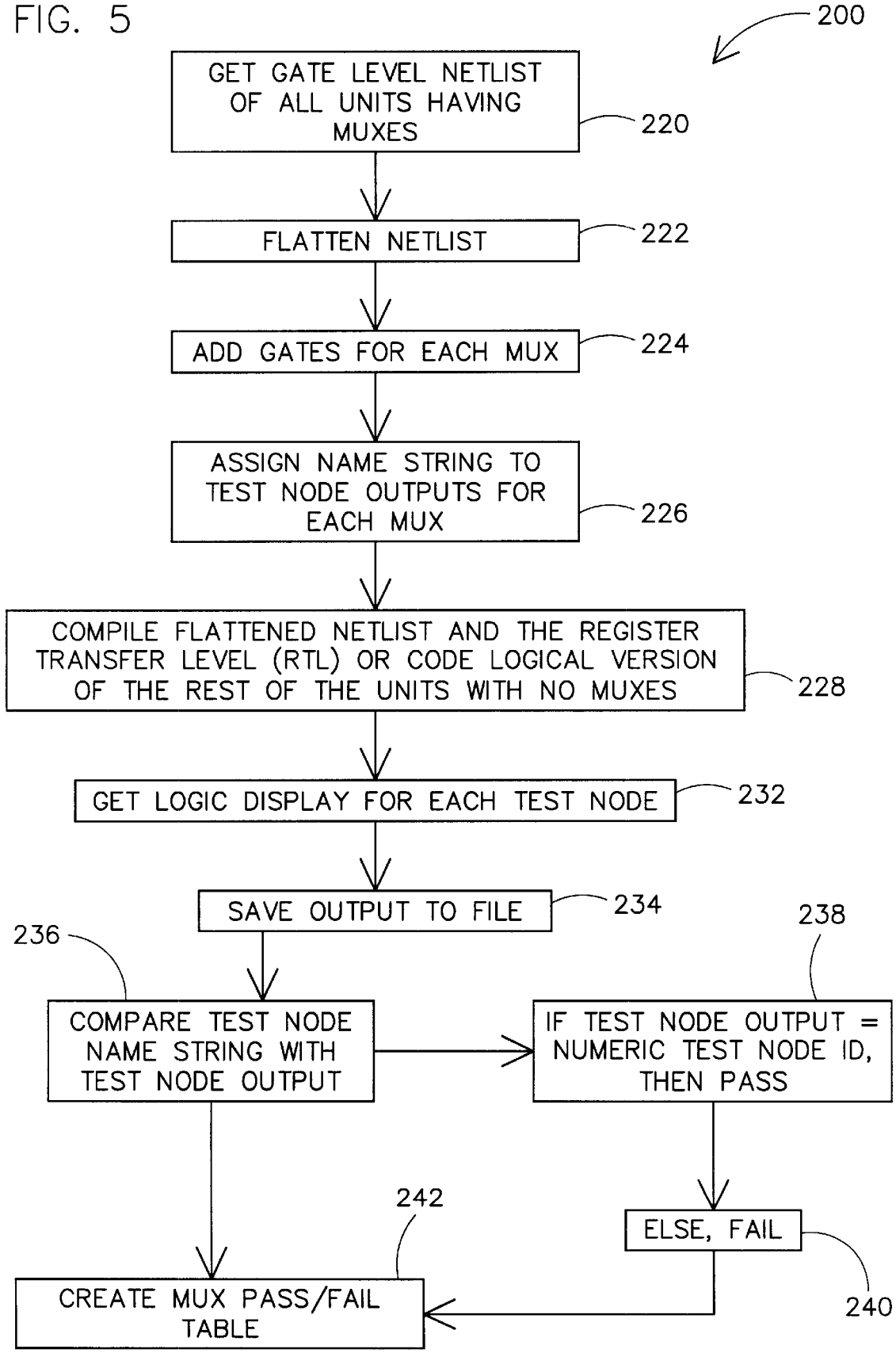
FIG. 5 is a flowchart of the process of the present invention.

More particularly, and referring now to FIG. 5, a more detailed flowchart of the above described process 200 is depicted. As is known in the art, certain subroutines exist that allow the gathering of a list of devices contained within complex circuitry. Such device lists may be obtained from low circuit levels to high circuit levels. In this case, such a subroutine is utilized to obtain a gate level list of all units having multiplexers in them as in step 220. Normally such a list is provided in a hierarchical or tree fashion. For purposes of this invention, it is desirable to "flatten" that list into a string-type list for further manipulation as in step 222.

Then, given the flattened list including all multiplexers, the gate array 12 depicted in FIG. 3 is added to the list for each multiplexer as in step 224. Thus, the above described test node outputs are then defined and name strings instantiated for each such test node output as previously described as indicated in step 226. The flattened list, gate arrays, and test node instantiations along with Register Transfer Levels (RTLs) (or code logical versions of circuits without multiplexers) are then combined into a list file and compiled as in step 228. The logic display for each test node is then depicted in a manner appreciated by a user such as a design engineer as in step 232. For instance, the logic display may consist of code or pseudo code or may be a graphical representation of circuit elements including textual information.

Given a circuit listing as described, certain commercial software programs are available to compile such circuit device lists and display the logical output for each or any node desired in the list. An example of such a program is Chrysalis, offered now by Avant! Corporation of Fremont, Calif. Once the logical output for each node is obtained via such a program, then that logical output is saved to a file in memory as in step 234. It should be noted that such logical output may be numerical or may be an equation depending on the upstream circuitry. However, as noted above, there is only one output that is important to this process and that is whether the test node output matches the test node numerical ID string as described above. If the output is anything but a match for that numeric ID, a fail will be indicated.

Thus, the next step is to compare the test node outputs with the test node name string numeric ID (i.e. MUX1A=>1) as in step 236. If the output and string match for each test node of a multiplexer, then a pass will be recorded in a table file in memory for that multiplexer as in steps 238 and 242. Otherwise, a fail will be recorded in the table as in steps 240 and 242. For instance, desired results might be provided in the format of table 2.

TABLE 2

| | |
|---|---|
| MUXA | PASS |
| MUXB | PASS |
| MUXC | FAIL |
| MUXD | PASS |
| ... | ... |
| MUXn | PASS |

The table may then be reviewed by a design engineer or technician to ascertain whether the circuit design under testing requires further analysis. Such a tool is clearly useful to test and evaluation engineers to expedite circuit testing and redesign if necessary.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for verifying multiplexer select line exclusivity, comprising in combination:

listing all multiplexers to be tested into a gate level logic list, said listing includes all multiplexers within a subunit;

applying predefined gate logic to the multiplexers to be tested in said list;

instantiating predefined nomenclature to output nodes of said predefined gate logic wherein said nomenclature correlates to a multiplexer instance and the expected output of said node;

ascertaining logical output for said nodes;

comparing said logical outputs to said expected output as expressed in said predefined nomenclature;

providing the results of said comparison in a user readable manner;

selecting one or more multiplexers from said list; and providing a pass/fail test, said pass/fail test comprising a pass when said comparison results in a match, and a fail when said comparison does not result in a match.

2. The method for verifying multiplexer select line exclusivity of claim 1 wherein said listing includes all multiplexers logically related across a plurality of subunits.

3. The method for verifying multiplexer select line exclusivity of claim 1 wherein said listing includes all multiplexers logically related across a plurality of units.

* * * * *